United States Patent
Kleveland et al.

(10) Patent No.: US 6,574,145 B2
(45) Date of Patent: Jun. 3, 2003

(54) MEMORY DEVICE AND METHOD FOR SENSING WHILE PROGRAMMING A NON-VOLATILE MEMORY CELL

(75) Inventors: Bendik Kleveland, Santa Clara, CA (US); James M. Cleeves, Redwood City, CA (US); Roy E. Scheuerlein, Cupertino, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 09/896,815

(22) Filed: Jun. 29, 2001

(65) Prior Publication Data

US 2002/0136076 A1 Sep. 26, 2002

Related U.S. Application Data

(60) Provisional application No. 60/277,794, filed on Mar. 21, 2001, provisional application No. 60/277,815, filed on Mar. 21, 2001, and provisional application No. 60/277,738, filed on Mar. 21, 2001.

(51) Int. Cl.$^7$ .............................................. G11C 16/04
(52) U.S. Cl. ............................ 365/185.19; 365/185.14; 365/185.21
(58) Field of Search ................ 365/225.7, 185.19, 365/185.2, 185.21, 185.23, 185.14

(56) References Cited

U.S. PATENT DOCUMENTS

| | | | |
|---|---|---|---|
| 4,763,305 A | 8/1988 | Kuo ............................ 365/200 |
| 4,860,259 A | 8/1989 | Tobita ........................ 365/201 |
| 5,287,326 A | 2/1994 | Hirata .................... 365/230.03 |
| 5,442,589 A | 8/1995 | Kowalski ................. 365/225.7 |
| 5,532,964 A | * 7/1996 | Cernea et al. ......... 365/185.18 |
| 5,600,593 A | * 2/1997 | Fong ..................... 365/118.19 |
| 5,654,917 A | 8/1997 | Ogura et al. ........... 365/185.18 |
| 5,768,208 A | * 6/1998 | Bruwer et al. ......... 365/184.04 |
| 5,784,320 A | 7/1998 | Johnson ................. 365/189.01 |
| 5,864,503 A | 1/1999 | Pascucci ................ 365/185.22 |
| 6,002,614 A | 12/1999 | Banks .................... 365/189.01 |
| 6,011,715 A | * 1/2000 | Pasotti et al. .......... 365/185.03 |
| 6,034,882 A | 3/2000 | Johnson et al. ............. 365/103 |
| 6,076,138 A | * 6/2000 | Shin ...................... 365/185.33 |
| 6,163,484 A | 12/2000 | Uekubo ................... 365/185.2 |
| 6,163,848 A | 12/2000 | Gephardt et al. ........... 713/322 |
| 6,195,283 B1 | * 2/2001 | Rolandi et al. ......... 365/185.03 |

* cited by examiner

*Primary Examiner*—Michael S. Lebentritt
*Assistant Examiner*—Hien Nguyen
(74) *Attorney, Agent, or Firm*—Brinks Hofer Gilson & Lione (57) ABSTRACT

The preferred embodiments described herein provide a memory device and method for sensing while programming a non-volatile memory cell. In one preferred embodiment, a memory device is provided with a memory cell and a detection circuit. While the memory cell is being programmed, the detection circuit determines whether the memory cell is in a programmed state. If the memory cell is in a programmed state, the programming of the memory cell is terminated. As compared with prior programming approaches, this preferred embodiment reduces programming time and power while increasing programming bandwidth (the number of memory cells that can be programmed per unit time). In another preferred embodiment, a plurality of memory cells along a wordline are programmed simultaneously. Other preferred embodiments are provided, and each of the preferred embodiments can be used alone or in combination with one another.

40 Claims, 6 Drawing Sheets

MEMORY DEVICE AND METHOD FOR SENSING WHILE PROGRAMMING A NON-VOLATILE MEMORY CELL

CROSS-REFERENCE TO RELATED APPLICATIONS

This application claims the benefit of the following U.S. provisional applications, each of which was filed on Mar. 21, 2001: U.S. Provisional Application No. 60/277,794, U.S. Provisional Application No. 60/277,815 and U.S. Provisional Application No. 60/277,738. Each of the above-referenced applications is hereby incorporated by reference.

BACKGROUND

Several methods are known for programming non-volatile memory cells. One method applies a programming pulse of a sufficiently long duration to guarantee that the memory cell will be programmed. In order to guarantee that every memory cell will be programmed using this method, programming time and power are set for worst-case conditions. Accordingly, this "over-provisioning" approach can result in excessive average programming time, power, and energy. In another method, a series of short, high-voltage programming pulses is applied to the memory cell. After each programming pulse, a nominal-voltage reading pulse is applied to determine whether the memory cell is in a programmed state. If the memory cell is in a programmed state, no further programming pulses are applied. Otherwise, an additional programming pulse is applied, and the sequence of reading and programming continues until the memory cell is in a programmed state. One disadvantage of this approach is the time and power overhead associated with switching between program and read voltages. Additionally, because the time-dependent dielectric breakdown (TDDB) for programmable read-only (PROM) type memory cells increases with multiple, short programming pulses (as compared to a long, continuous programming pulse), this approach can result in excessive programming energy. The time delays associated with these approaches can be especially noticeable to a user when the memory cell is part of a field-programmable memory device used with portable consumer products, such as digital cameras.

There is a need, therefore, for a memory device and method that will overcome the disadvantages described above.

SUMMARY

The present invention is defined by the following claims, and nothing in this section should be taken as a limitation on those claims.

By way of introduction, the preferred embodiments described below provide a memory device and method for sensing while programming a non-volatile memory cell. In one preferred embodiment, a memory device is provided with a memory cell and a detection circuit. While the memory cell is being programmed, the detection circuit determines whether the memory cell is in a programmed state. If the memory cell is in a programmed state, the programming of the memory cell is terminated. As compared with prior programming approaches, this preferred embodiment reduces programming time and power while increasing programming bandwidth (the number of memory cells that can be programmed per unit time). In another preferred embodiment, a plurality of memory cells along a wordline are programmed simultaneously. Other preferred embodiments are provided, and each of the preferred embodiments can be used alone or in combination with one another.

The preferred embodiments will now be described with reference to the attached drawings.

DETAILED DESCRIPTION OF THE PRESENTLY PREFERRED EMBODIMENTS

The preferred embodiments described herein relate to programming a non-volatile memory cell (i.e., a memory cell whose data is not lost or altered when electrical power is removed). Although any suitable memory array can be used, in one preferred embodiment, the memory cell is part of a three-dimensional memory array, which provides important economies in terms of reduced size and associated reductions in manufacturing cost. The memory array can be part of a compact, modular memory device used with portable consumer products such as digital cameras. In one preferred embodiment, the memory cell is field-programmable. A field-programmable memory cell is a memory cell that is fabricated in an initial, un-programmed digital state and can be switched to an alternative, programmed digital state at a time after fabrication. Although any suitable type of memory cell can be used, in one preferred embodiment, the memory cell is a write-once memory cell comprising an antifuse and a diode, as described in U.S. Pat. No. 6,034,882 to Johnson et al. and U.S. patent application Ser. No. 09/638,428, both of which are hereby incorporated by reference. In its un-programmed state, the antifuse is intact, and the memory cell holds a Logic 1. When suitable voltages are applied to the appropriate wordline and bitline, the antifuse of the memory cell is blown, and the diode is connected between the wordline and the bitline. This places the memory cell in a programmed (Logic 0) state. Alternatively, the un-programmed state of the memory cell can be Logic 0, and the programmed state can be Logic 1. (Memory cells that support multiple programmed states can also be used.) Being write-once, the initial, un-programmed digital state cannot be restored once the memory cell is switched to the programmed digital state. Instead of being write-once, the memory cell can be write-many. Unlike the digital state of a write-once memory cell, the digital state of a write-many memory cell can be switched between "un-programmed"

and "programmed" digital states. When referring to write-many memory cells, the un-programmed digital state refers to the digital state of the memory cell before a programming operation. Accordingly, the un-programmed digital state can refer to either Logic 0 or Logic 1 (in a two-state memory cell) and does not necessarily refer to the digital state in which that memory cell was fabricated.

Figure 1:
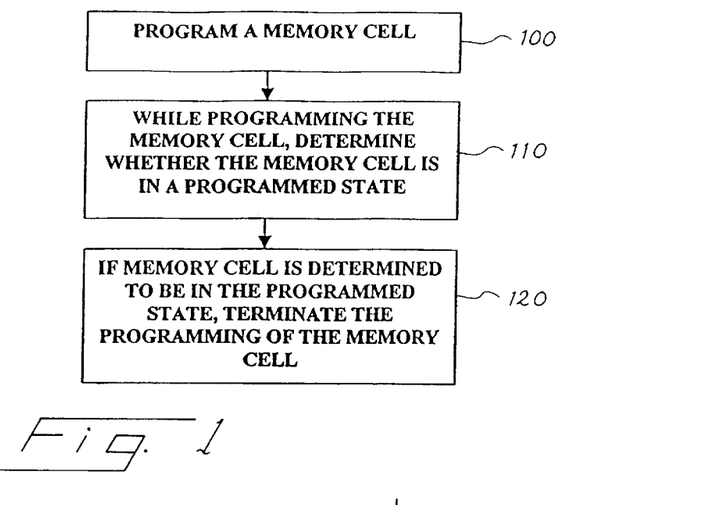
FIG. 1 is a flow chart of a method of a preferred embodiment for programming a memory cell.

Turning now to the drawings, FIG. 1 is a flow chart of a method of a preferred embodiment to reduce programming time and power while increasing programming bandwidth (the number of memory cells that can be programmed per unit time). The first act in this method is to program a memory cell (act 100). "Programming a memory cell" refers to providing appropriate voltages to the wordline and bitline of a memory cell. In some situations, the appropriate voltages to the wordline and/or bitline are "provided" by taking some action. For example, to program a memory cell, a programming pulse can be applied on the wordline of the memory cell, and the bitline of the memory cell can be grounded (or driven to some relatively low voltage). In other situations, the appropriate voltage on the wordline and/or bitline is "provided" by not removing the voltage already being applied. This can occur, for example, when sequentially programming two or more memory cells along the same wordline. To program the first memory cell, a programming pulse is applied on the wordline, and the bitline of the first memory cell is grounded. To program the second memory cell, the programming pulse is "provided" by not removing the programming pulse previously applied to the wordline, and the bitline of the second memory cell is grounded.

While programming the memory cell, it is determined whether the memory cell is in a programmed state (act 110). If the initial, un-programmed state of a memory cell is Logic 1 (or Logic 0), the programmed state is Logic 0 (or Logic 1). With memory cells having three or more states (e.g., Logic 0, 1, and 2), the memory cell is in a programmed state when switched to a desired level (e.g., Logic 1 or 2). The embodiments below describe several preferred detection circuits that can be used to determine whether the memory cell is in a programmed state. Because the state of the memory cell is sensed while the memory cell is being programmed, the programming pulse on the wordline is not replaced with a nominal-voltage reading pulse. This avoids the disadvantages encountered in the prior approaches; namely, the time and power overhead associated with switching between program and read voltages and the increase in the time-dependent dielectric breakdown (TDDB) of the memory cell.

If memory cell is determined to be in the programmed state, the programming of the memory cell is terminated either immediately or after some delay (act 120). To terminate the programming of the memory cell, the voltage on the wordline and/or bitline is altered. For example, the programming pulse can be removed from the wordline, and the ground can be removed from the bitline. If two memory cells on the same wordline are to be programmed, it is preferred to allow the programming pulse to remain on the wordline. In this situation, the programming of the memory cell is terminated by removing the ground from the bitline while allowing the programming pulse to remain on the wordline.

Figure 2:
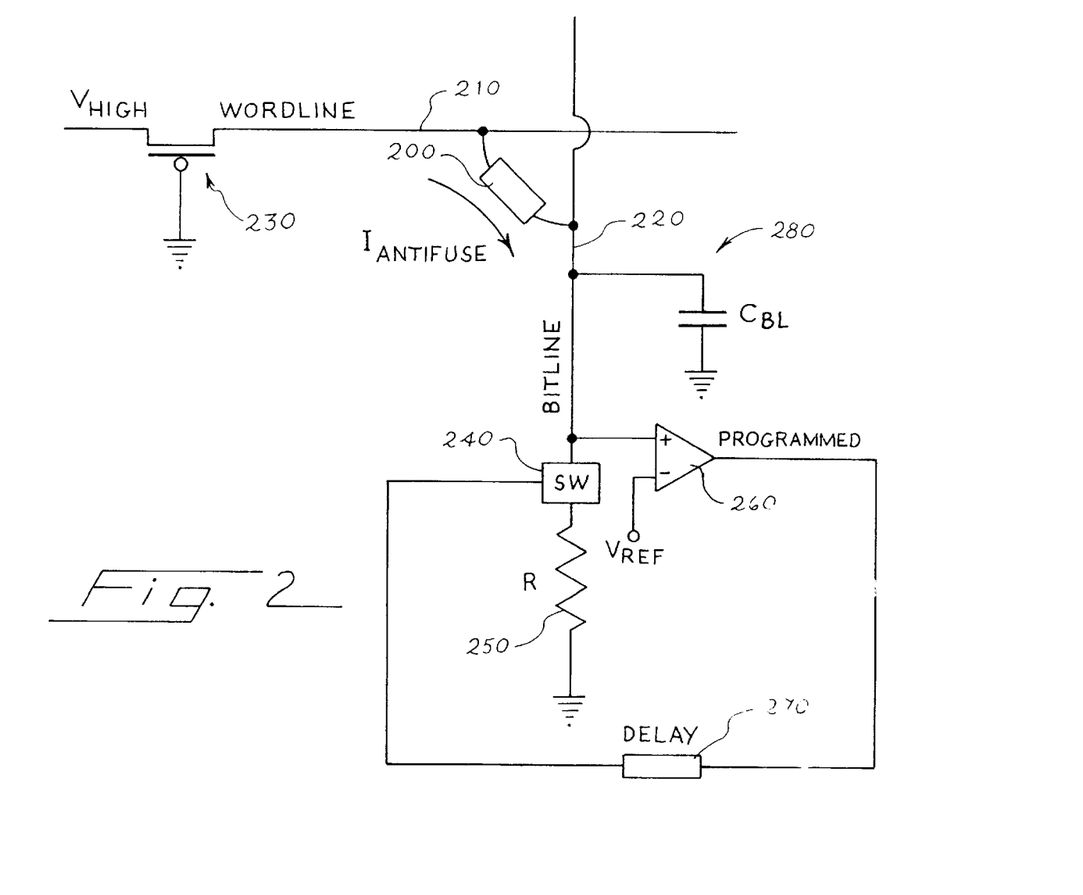
FIG. 2 is an illustration of a memory array of a preferred embodiment having a series resistance bitline pulldown.

Turning again to the drawings, FIG. 2 is an illustration of a memory array of a preferred embodiment having a series resistance bitline pulldown. The memory array comprises a memory cell 200 associated with a wordline 210 and a bitline 220. For simplicity, other memory cells, wordlines, and bitlines of the memory array are not shown in FIG. 2. The memory array also comprises a detection circuit connected to the memory cell 200. As used herein, the terms "connected to" and "coupled with" are intended broadly to cover components that are connected to or coupled with one another either directly or indirectly through one or more named or unnamed intervening components. The detection circuit is operative to detect, while the memory cell 200 is being programmed, when the memory cell 200 is in a programmed state.

To program a memory cell in the array, selector circuitry (not shown) selects and applies suitable voltages to the wordline and bitline associated with that memory cell. For example, to program memory cell 200, a row decoder can ground the gate of the row-select p-channel MOSFET 230 to apply a programming pulse $V_{High}$ on wordline 210, and a column decoder can close switch 240 to ground bitline 220. Before the memory cell 200 is in a programmed state, the antifuse of the memory cell 200 is still intact, and the only current drawn through the memory cell 200 ($I_{Antifuse}$) is a very small leakage current ($I_{Leakage}$). As a result, the voltage across the resistor 250 (the bitline voltage) is close to ground ($V_{Bitline}=I_{Leakage}\times R$). When the memory cell 200 reaches the programmed state, the antifuse is blown, and the current drawn in the memory cell 200 is high ($I_{Program}$). As a result, the voltage across the resistor 250 rises ($V_{Bitline}=I_{Program}\times R$). Accordingly, a low bitline voltage indicates that the memory cell 200 is in an un-programmed state, and a high bitline voltage indicates that the memory cell 200 is in a programmed state. A comparator 260 is used to detect the change in the bitline voltage and provides a signal (Programmed) when the voltage on the bitline 220 is greater than a reference voltage $V_{ref}$. The resistance R of the resistor 250 is chosen such that the voltage developed at the input of the comparator 260 after the memory cell 200 is in a programmed state is larger than the reference voltage $V_{ref}$. Represented mathematically, $R \times I_{Program} > V_{ref}$. Resistor 250 can be a dedicated or parasitic resistance as long as that resistance is high enough for a consistent voltage to be sensed after the memory cell 200 is in a programmed state.

The Programmed signal provided by the comparator 260 is used to open the switch 240 to remove the ground from the bitline 220, thereby terminating the programming of the memory cell 200. After the switch 240 has been opened, the bitline voltage rises due to the current through the programmed memory cell charging up the parasitic capacitance on the bitline 220 ($C_{BL}$), which is represented in FIG. 2 by capacitor 280. This rise in bitline voltage enables the programming of another memory cell on the same wordline 210. The Programmed signal can also be sent to selector circuitry, which programs another memory cell by closing the switch associated with that memory cell. If the next memory cell to be programmed is on a different wordline, the selector circuitry also turns off the p-channel MOSFET 230 to remove the programming pulse $V_{High}$ from wordline 210 and applies the programming pulse to the appropriate new wordline. The Programmed signal can be provided to the switch 240 or selector circuitry immediately or after a preset time, represented in FIG. 2 by delay 270. It may be preferred to use delay 270 with memory cells that require additional programming time to optimize read and leakage characteristics, such as antifuse cells. If the components of the detection circuit themselves introduce a suitable delay, the device characteristics of the written memory cell 200 can be optimized without the use of delay 270.

Figure 3:
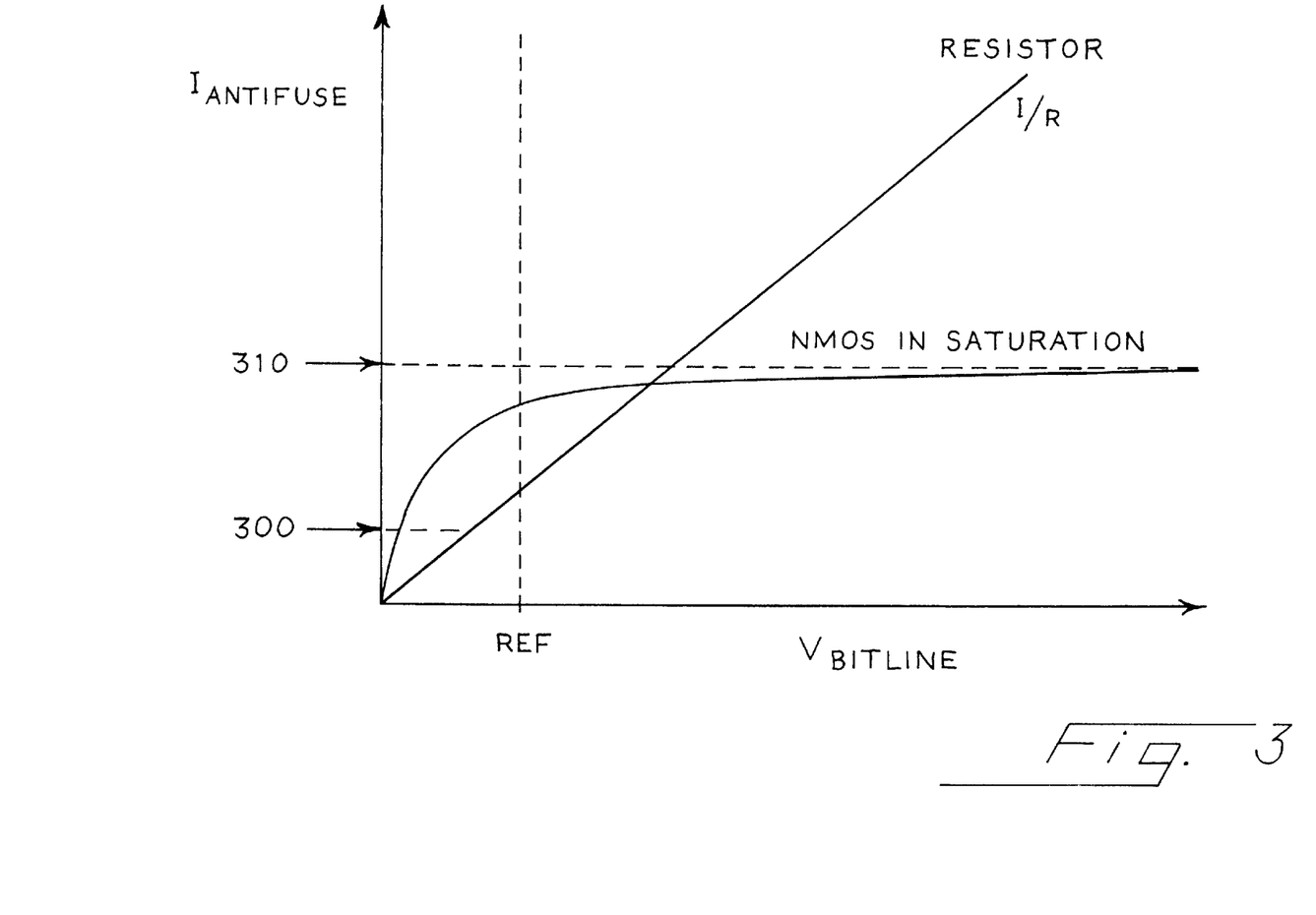
FIG. 3 is a graph of current-voltage characteristics of a resistor and an NMOS transistor.

In the memory array of FIG. 2, a series resistance bitline pulldown was used. It may be preferred, however, to use an NMOS transistor instead of a resistor. The benefits of using a transistor as compared to a resistor are illustrated in FIG. 3, which is a graph of current-voltage characteristics of a resistor and an NMOS transistor. As shown at 300, before the antifuse breaks, the voltage at the bitline is lower for the transistor than for the resistor at a given leakage current, resulting in higher stress across the antifuse. As shown at 310, after the antifuse breaks, the voltage developed at the bitline is much higher for the transistor than the resistor due to the high drain-to-source impedance of the transistor when it enters the saturation region, yielding a good margin for sensing.

Figure 4:
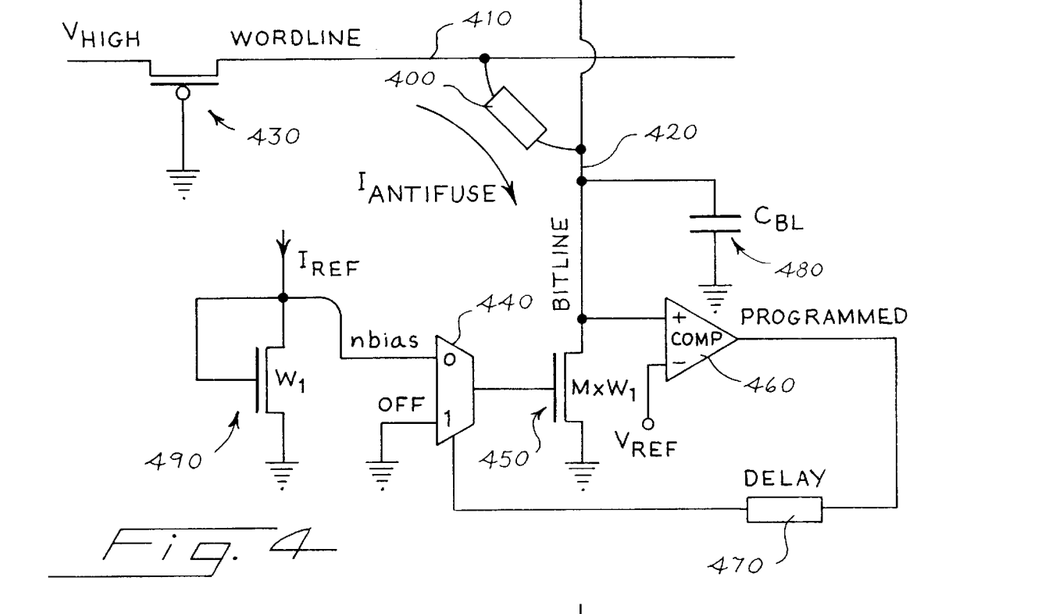
FIG. 4 is an illustration of a memory array of a preferred embodiment having a current-controlled bitline pulldown.

FIG. 4 is an illustration of a memory array of another embodiment in which the detection circuit includes a current-controlled bitline pulldown instead of a resistor. Before programming the memory cell 400, input 1 of the multiplexor 440 is applied to the gate of the pulldown transistor 450, and the pulldown transistor 450 is off. To program the memory cell 400, selector circuitry (not shown) grounds the gate of the row-select p-channel MOSFET 430 to apply a high-voltage programming pulse $V_{High}$ on wordline 410 and selects input 0 of the multiplexor 440, which applies a voltage of nbias to the gate of the pulldown transistor 450. Nbias mirrors a reference current ($I_{Ref}$) by the ratio M, which is in the order of the expected programming current to the bitline pulldown transistor 450. This voltage turns on the pulldown transistor 450 and drives the bitline 420 to ground. Before the memory cell 400 is in a programmed state, the current drawn in the memory cell 400 ($I_{Antifuse}$) is a very small leakage current, and the voltage across pulldown transistor 450 is close to ground. When the memory cell 400 reaches the programmed state, $I_{Antifuse}$ increases, and the voltage across the pulldown transistor 450 rises. The increase in bitline voltage is sensed with a comparator 460. When $I_{Antifuse}$ approximately exceeds M×$I_{Ref}$, the memory cell 400 has been programmed, and the comparator 460 outputs a Programmed signal. After an optional delay 470, input 1 of the multiplexor 440 is selected, turning off the pulldown transistor 450. The bitline voltage then rises due to parasitic capacitance on the bitline 420 ($C_{BL}$, represented by capacitor 480), enabling the programming of another memory cell on the same wordline 410. In an alternate embodiment (shown in FIG. 5), the bitline 520 is actively pulled up to $V_{High}$ by PMOS pullup transistor 595 in order to reduce current drawn from the wordline 510. Maintaining a high voltage on the wordline 510 speeds up the transition to program the next memory cell on the wordline 510, thereby improving bandwidth.

Figure 5:
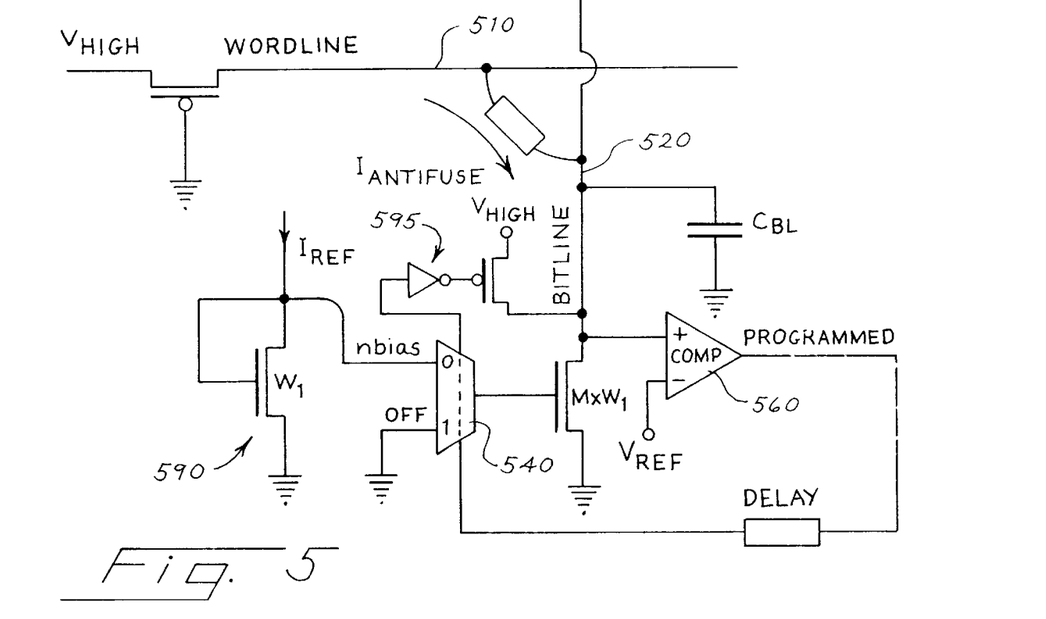
FIG. 5 is an illustration of the memory array of FIG. 4 in which a pull-up transistor is used.

In one preferred embodiment, $V_{High}$ is 7–10 volts, nbias is approximately 1.5 volts, $I_{Ref}$ is 5 micro-amps, $W_1$ is 1 micrometer, M is 20, and $V_{ref}$ is 0.5 volts. In this preferred embodiment, the voltage on the bitline due to leakage current is between 100 and 200 millivolts, the programming current is between 200 and 400 microamps, the voltage on the bitline after the memory cell has reached the programmed state is between 0.4 and 2 volts, and the voltage on the bitline rises to between 6 and 9 volts due to parasitic capacitance.

Figure 6:
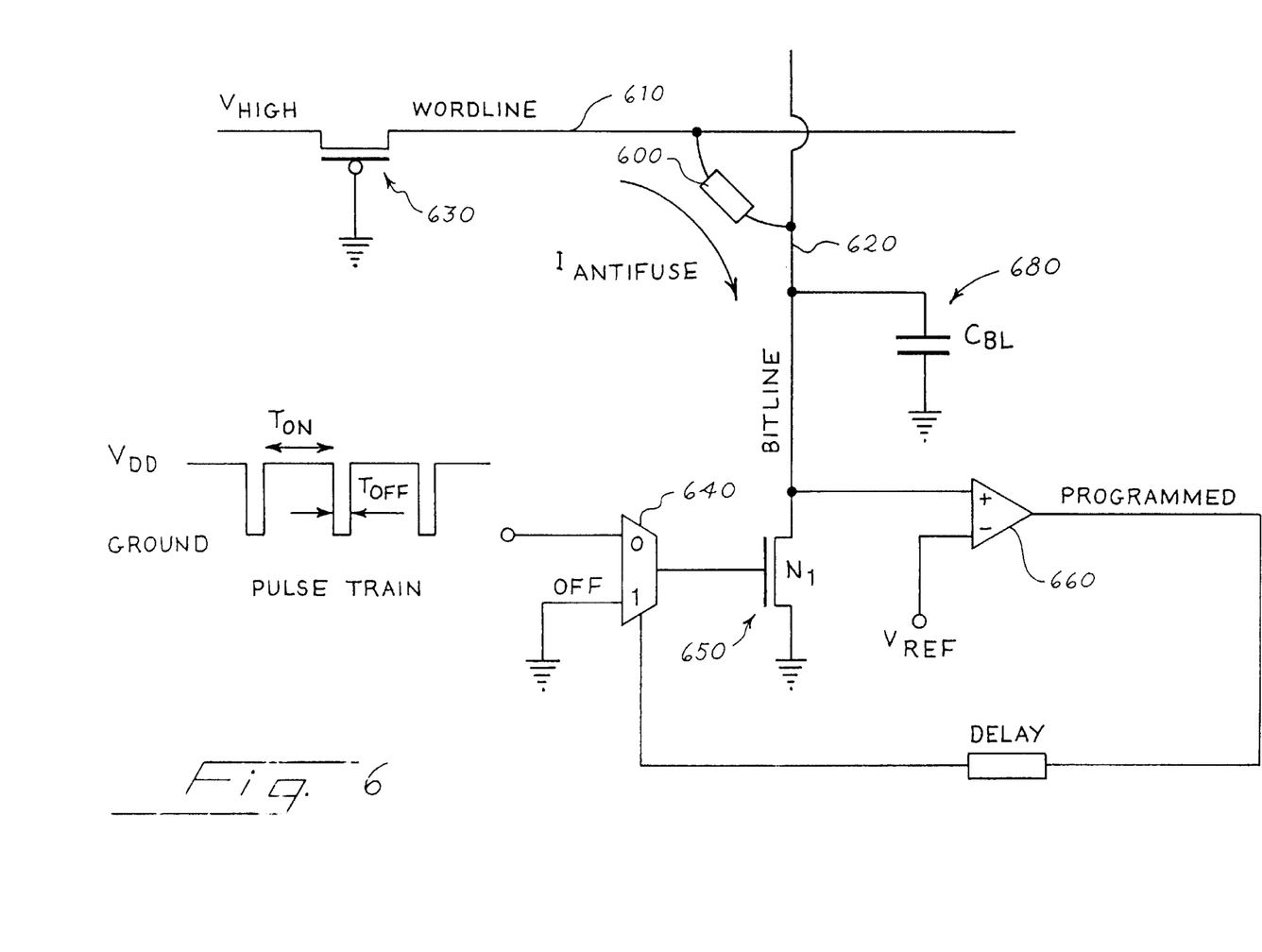
FIG. 6 is an illustration of a memory array of a preferred embodiment having a pulse-train-controlled bitline pulldown.

The comparator 460, 560 in the embodiments of FIGS. 4 and 5 is preferably implemented as an operational amplifier (op-amp) due to the relatively low reference voltage (e.g., 0.5 volts). The embodiment shown in FIG. 6 can be used if it is desired to use components that are easier to implement and smaller than an op-amp, such as CMOS inverter gates. In this embodiment, the comparator 660 is used to detect a relatively-higher voltage (e.g., 1.5 volts) that will be present on the bitline 620 after the memory cell 600 reaches the programmed state. As shown in FIG. 6, the current-mirroring transistor 490, 590 that provides nbias to input 0 of the multiplexor 440, 540 is replaced with a pulse train that oscillates between $V_{dd}$ (e.g., 3 volts) during $T_{ON}$ and ground during $T_{OFF}$. To program the memory cell 600, selector circuitry (not shown) grounds the gate of the row-select p-channel MOSFET 630 to apply a programming pulse $V_{High}$ on wordline 610 and selects input 0 of the multiplexor 640, driving the pulldown transistor 650 with the pulse train. During $T_{ON}$, the multiplexor 640 applies $V_{dd}$ to the pulldown transistor 650, driving the bitline 620 to ground. During $T_{OFF}$, the pulse train grounds the gate $N_1$ of the pulldown transistor 650. With the pulldown transistor 650 turned off, the voltage on the bitline 620 rises depending on the current drawn by the memory cell 600. Before the memory cell 600 is in a programmed state, there is only a small leakage current from the memory cell that is charging the parasitic capacitance $C_{BL}$. Accordingly, the bitline voltage will not rise to the reference level of the comparator 660, and the pulse train will oscillate back to $V_{dd}$ to drive the bitline 620 to ground. However, when the memory cell 600 is in a programmed state, there is greater current from the programmed antifuse memory cell that charges up the parasitic capacitance, and the bitline voltage will rise to the reference level of the comparator 660. When this occurs, the comparator 660 outputs the Programmed signal to select input 1 of the multiplexor 640, turning off the pulldown transistor 650.

Unlike the prior approach of using a series of write and read pulses to determine whether a memory cell is in a programmed state, this preferred embodiment senses the programmed state of the memory cell while the programming pulse is being applied to the wordline 610. Because the wordline 610 is kept at a high voltage during sensing, there is no overhead in switching to read voltage conditions, as is encountered in the prior approach. Also, while the multiple, short programming pulses used in the prior approach increase the time-dependent dielectric breakdown (TDDB) for the memory cell, the pulse train in this embodiment can be designed with a fast repetition to allow for close to DC TDDB stress conditions. In one preferred implementation, $T_{ON}$ is 500 nanoseconds, $T_{OFF}$ is 20 nanoseconds, the bitline capacitance $C_{BL}$ is 1 to 2 picofarads, $N_1$ is 20 micrometers, the reference voltage $V_{ref}$ is 1.5 volts, and the programming current is 200 to 400 microamps.

As noted above, multiple memory cells (e.g., 1024 memory cells) can be associated with a wordline. In the preferred embodiments described above, only one memory cell along a wordline was selected by selector circuitry for programming. For example, in FIG. 4, selector circuitry selected input 0 of multiplexor 440 to apply a voltage of nbias to the gate of the pulldown transistor 450, while allowing input 1 to remain on the multiplexors associated with the other memory cells on the wordline 410. When one memory cell reaches the programmed state, selector circuitry selects input 1 of the multiplexor of that memory cell and selects input 0 of the multiplexor of the next memory cell along that wordline 410 to be programmed. If the leakage current through a memory cell is small enough that the voltage drop on the wordline will not prevent other memory cells along the wordline from reaching their programmed state, multiple memory cells along the wordline can be programmed simultaneously, thereby increasing bandwidth.

Figure 7:
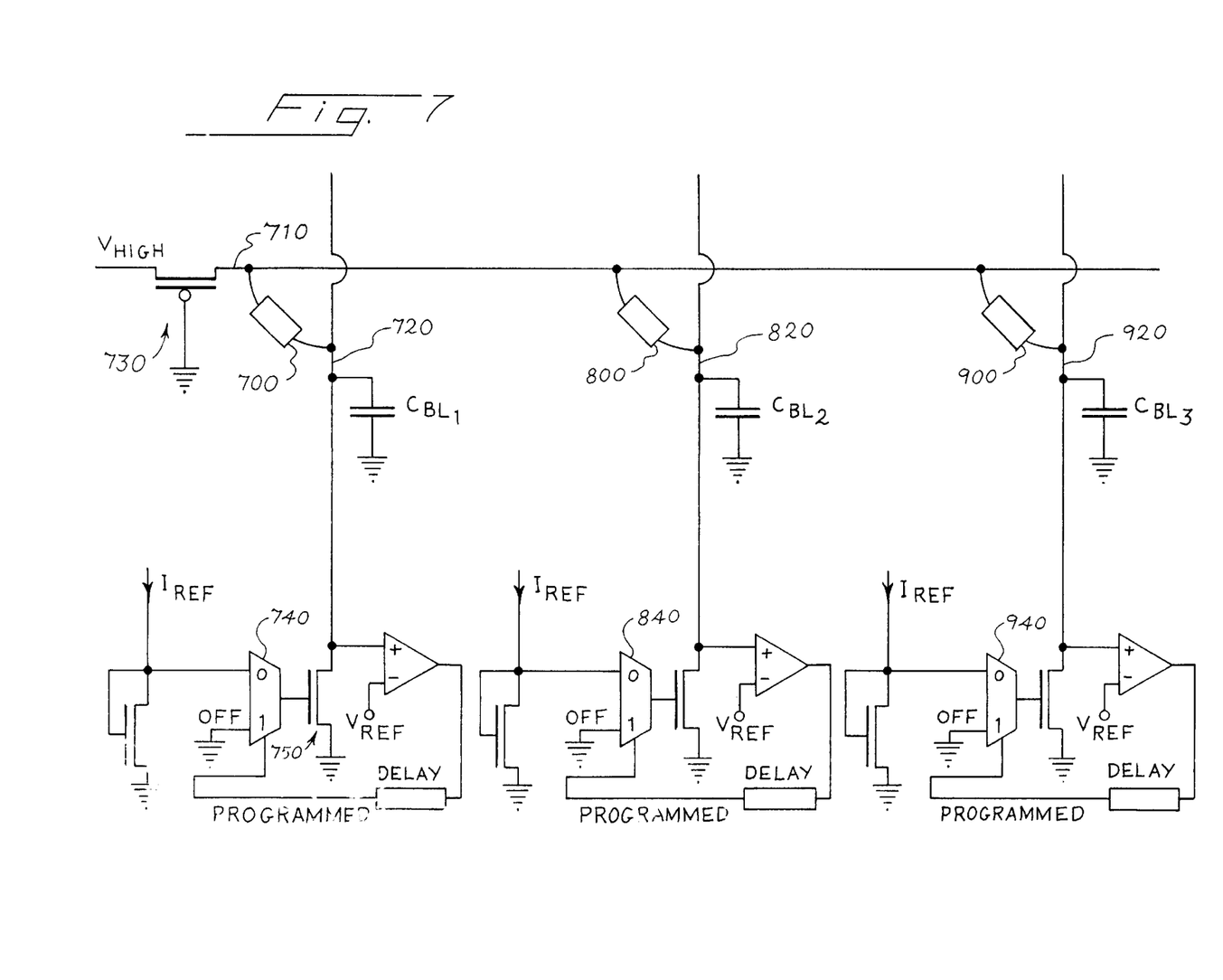
FIG. 7 is an illustration of a memory array of a preferred embodiment in which multiple memory cells along a wordline are programmed simultaneously.

FIG. 7 illustrates such an embodiment. While this embodiment uses the current reference design of FIGS. 4 and 5, it should be noted that the pulse train design of FIG. 6 can also be used. In this example, memory cells 700 and 800 are programmed simultaneously. Depending on the configuration of the memory array, more than two memory cells can be programmed at once. In operation, selector circuitry (not shown) grounds the gate of the row-select p-channel MOSFET 730 to apply a high-voltage programming pulse $V_{High}$ on the wordline 710 and selects input 0 of multiplexor 740 and multiplexor 840 to drive bitline 720 and bitline 820, respectively, to ground. Because memory cell 900 is not being programmed, selector circuitry does not switch multiplexor 940 to input 1. When memory cell 700, for example, reaches its programmed state, the current on bitline 720 increases, and the voltage on the wordline 710 drops, which can prevent memory cell 800 from reaching its programmed state. However, because each memory cell has its own detection circuit, a programmed state of one memory cell is detected independently of the others. Accordingly, when the detection circuit senses that memory cell 700 is in the programmed state, the pulldown transistor 750 is turned off, preventing bitline 720 from continuing to steal the wordline current. The wordline voltage then increases to stress and program memory cell 800. In addition, selector circuitry selects input 0 of multiplexor 940 to drive bitline 920 to ground to program memory cell 900.

Figure 8:
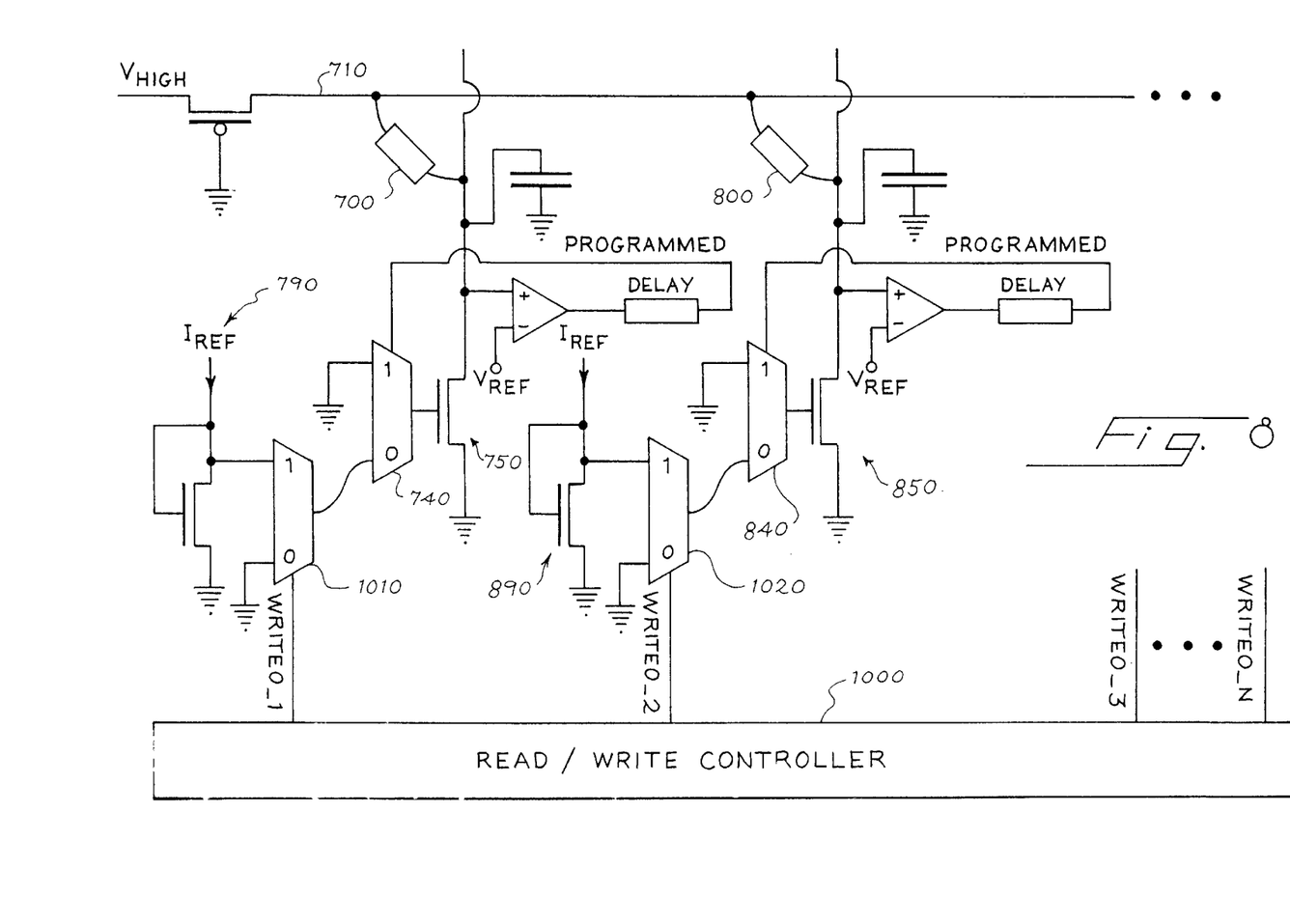
FIG. 8 is an illustration of a memory array of a preferred embodiment in which a read/write controller selects memory cells along a wordline for programming.

In a preferred embodiment, a read/write controller 1000 is used to select one or more memory cells along a wordline for programming, as shown in FIG. 8. With reference to the memory array of FIG. 7, multiplexors 1010, 1020 are interposed between the current mirroring transistors 790, 890 and multiplexors 740, 840 to select memory cells 700 and 800, respectively, using the read/write controller 1000. Similar multiplexors are used to control the other memory cells (not shown) along the wordline 710. To program memory cell 700 without programming the other memory cells along the wordline 710, the read/write controller 1000 applies a high voltage on WRITE0_1 while applying a low voltage on the other WRITE0 outputs. The high voltage on WRITE0_1 selects input 1 of multiplexor 1010, which applies a voltage of nbias to the gate of the pulldown transistor 750 via multiplexor 740. In contrast, the low voltage on WRITE0_2 selects input 0 of multiplexor 1020, which grounds the gate of pulldown transistor 850 via multiplexor 840. A similar operation occurs with the other multiplexors and pulldown transistors along the wordline 710. To select multiple memory cells for simultaneous programming, a high voltage is applied to two or more of the WRITE0 outputs. The read/write controller 1000 can also be used to skip memory cells that do not need to be programmed, as described in "Method and System for Increasing Programming Bandwidth in a Non-Volatile Memory Device," U.S. patent application Ser. No. 09/895,960 filed Jun. 29, 2001, which is hereby incorporated by reference. This application also describes several alternatives to the operation of the read/write controller 1000.

There are several alternatives that can be used with any of these preferred embodiments. For example, a strong pulldown can be used before the current or pulse train sensing to ensure that high leakage memory cells that tend to program fast are programmed before the sensing starts. Similarly, a strong pulldown can be applied during the delay after the programmed state has been sensed to ensure a certain current/injected charge for optimum read/leakage characteristics. Additionally, as noted above, a separate delay device may be optional in some memory arrays. Also, the Programmed signal can be supplied to selector circuitry before or after the delay. Further, instead of comparing a sensed voltage to a reference voltage, sensed current on the bitline can be compared to a reference current. In another alternative embodiment, the memory cell supports multiple programmed states, and the detection circuitry described above is modified accordingly. Consider, for example, a memory that supports four logic states: Logic 0, Logic 1, Logic 2, and Logic 3. This memory cell is in the Logic 0 state when only leakage current is drawn through the memory cell. However, the memory cell is in the Logic 1, 2, and 3 states when a current of 100 microamps, 200 microamps, and 300 microamps, for example, passes through the memory cell. The reference voltages on the comparator can be adjusted according to the desired logic state.

On Mar. 21, 2001, the following U.S. patent applications were filed, each of which is hereby incorporated by reference: "Memory Device with Row and Column Decoder Circuits Arranged in a Checkerboard Pattern under a Plurality of Memory Arrays," U.S. Provisional Application No. 60/277,794; "Passive Element Memory Array and Related Circuits Useful Therefor," U.S. Provisional Application No. 60/277,815; "Three-Dimensional Memory Array," U.S. Provisional Application No. 60/277,738; and "Three-Dimensional Memory Array and Method of Fabrication," U.S. application Ser. No. 09/814,727.

On Jun. 29, 2001, the following U.S. patent applications were filed, each of which is hereby incorporated by reference: "Method and Apparatus for Writing Memory Arrays Using External Source of High Programming Voltage," U.S. patent application Ser. No. 09/897,785; "Three-Dimensional Memory Array Incorporating Serial Chain Diode Stack," U.S. patent application Ser. No. 09/897,795; "Method and Apparatus for Biasing Selected and Unselected Array Lines when Writing a Memory Array," U.S. patent application Ser. No. 09/897,771; "Memory Device with Row and Column Decoder Circuits Arranged in a Checkerboard Pattern under a Plurality of Memory Arrays," U.S. patent application Ser. No. 09/896,814; "Method and System for Increasing Programming Bandwidth in a Non-Volatile Memory Device," U.S. patent application Ser. No. 09/896,814; "Method and Apparatus for Discharging Memory Array Lines," U.S. patent application Ser. No. 09/897,784; "Current Sensing Method and Apparatus Particularly Useful for a Memory Array of Cells Having Diode-Like Characteristics," U.S. patent application Ser. No. 10/253,024; "Memory Array Incorporating Noise Detection Line," U.S. patent application Ser. No. 09/897,704; and "Memory Device and Method for Sensing while Programming a Non-Volatile Memory Cell," U.S. patent application Ser. No. 09/895,815.

It is intended that the foregoing detailed description be understood as an illustration of selected forms that the invention can take and not as a definition of the invention. It is only the following claims, including all equivalents, that are intended to define the scope of this invention. Finally, it should be noted that any aspect of any of the preferred embodiments described herein can be used alone or in combination with one another.

What is claimed is:

1. A method for programming a memory cell, the method comprising:
   (a) programming a memory cell in a memory array comprising a plurality of layers of memory cells stacked vertically above one another in a single chip;
   (b) while programming the memory cell, determining whether the memory cell is in a programmed state; and
   (c) if the memory cell is determined to be in the programmed state, terminating the programming of the memory cell.

2. The method of claim 1, wherein (a) comprises providing a programming pulse on a wordline of the memory cell and grounding a bitline of the memory cell.

3. The method of claim 1, wherein (b) comprises comparing a voltage across a resistance on a bitline of the memory cell to a reference voltage.

4. The method of claim 1, wherein (b) comprises comparing a voltage across a current-controlled bitline pulldown transistor to a reference voltage.

5. The method of claim 1, wherein (b) comprises using a pulse-train-controlled bitline pulldown transistor.

6. The method of claim 1, wherein (a) comprises providing a programming pulse on a wordline of the memory cell, and wherein (c) comprises removing the programming pulse from the wordline.

7. The method of claim 1, wherein (a) comprises grounding a bitline of the memory cell, and wherein (c) comprises increasing voltage on the bitline.

8. The method of claim 7, wherein the memory cell charges up parasitic capacitance of the bitline to increase the voltage on the bitline.

9. The method of claim 7, wherein a pullup transistor charges up parasitic capacitance of the bitline to increase the voltage on the bitline.

10. The method of claim 1, wherein (a) comprises providing a programming pulse on a wordline of the memory cell and grounding a bitline of the memory cell, and wherein (c) comprises removing the programming pulse from the wordline and increasing voltage on the bitline.

11. The method of claim 1, wherein the programming of the memory cell is terminated immediately after the memory cell is determined to be in the programmed state.

12. The method of claim 1, wherein the programming of the memory cell is terminated at a time after the memory cell is determined to be in the programmed state.

13. The method of claim 1 further comprising:
(d) programming a second memory cell after terminating the programming of the memory cell recited in acts (a)–(c).

14. The method of claim 1, wherein the memory cell comprises an antifuse.

15. The method of claim 1, wherein the memory cell comprises a write-once memory cell.

16. The method of claim 1, wherein the memory cell comprises a write-many memory cell.

17. The method of claim 1, wherein the memory cell comprises a field-programmable memory cell.

18. A memory device comprising:
a memory array comprising a plurality of layers of memory cells stacked vertically above one another in a single chip; and
a detection circuit operative to detect, while a memory cell of the memory array is being programmed, when the memory cell is in a programmed state.

19. The memory device of claim 18, wherein the detection circuit is further operative to terminate the programming of the memory cell when the memory cell is detected to be in the programmed state.

20. The memory device of claim 19, wherein the detection circuit terminates the programming of the memory cell by removing a programming pulse from a wordline of the memory cell.

21. The memory device of claim 19, wherein the detection circuit terminates the programming of the memory cell by increasing voltage on a bitline of the memory cell.

22. The memory device of claim 19, wherein the detection circuit terminates the programming of the memory cell by removing a programming pulse from a wordline of the memory cell and by increasing voltage on a bitline of the memory cell.

23. The memory device of claim 18, wherein the detection circuit comprises a series resistance bitline pulldown.

24. The memory device of claim 18, wherein the detection circuit comprises a current-controlled bitline pulldown.

25. The memory device of claim 18, wherein the detection circuit comprises a pulse-train-controlled bitline pulldown.

26. The memory device of claim 18, further comprising an additional memory cell and an additional detection circuit operative to detect, while the additional memory cell is being programmed, when the additional memory cell is in a programmed state.

27. The memory device of claim 26, wherein the memory cell and the additional memory cell share a wordline.

28. The memory device of claim 18, the memory cell comprises an antifuse.

29. The memory device of claim 18, wherein the memory cell comprises a write-once memory cell.

30. The memory device of claim 18, wherein the memory cell comprises a write-many memory cell.

31. The memory device of claim 18, wherein the memory cell comprises a field-programmable memory cell.

32. A method for simultaneously programming a plurality of memory cells along a wordline, the method comprising:
(a) simultaneously programming a plurality of memory cells along a wordline, the memory cells being part of a memory array comprising a plurality of layers of memory cells stacked vertically above one another in a single chip;
(b) while programming the plurality of memory cells, independently determining whether each memory cell is in a programmed state; and
(c) if a memory cell of the plurality of memory cells is determined to be in the programmed state, terminating the programming of the memory cell.

33. The method of claim 32, further comprising:
(d) programming an additional memory cell along the wordline after terminating the programming of the memory cell.

34. The method of claim 32, each memory cell comprises an antifuse.

35. The method of claim 32, wherein each memory cell comprises a write-once memory cell.

36. The method of claim 32, wherein each memory cell comprises a write-many memory cell.

37. The method of claim 32, wherein each memory cell comprises a field-programmable memory cell.

38. A method for programming a memory cell, the method comprising:
(a) programming a memory cell;
(b) while programming the memory cell, determining whether the memory cell is in a programmed state; and (c) if the memory cell is determined to be in the programmed state, terminating the programming of the memory cell;

wherein the programming of the memory cell is terminated at a time after the memory cell is determined to be in the programmed state.

39. A memory device comprising:

a memory cell; and a detection circuit operative to detect, while the memory cell is being programmed, when the memory cell is in a programmed state;

wherein the detection circuit is further operative to terminate the programming of the memory cell at a time after the memory cell is determined to be in the programmed state.

40. A method for simultaneously programming a plurality of memory cells along a wordline, the method comprising:

(a) simultaneously programming a plurality of memory cells along a wordline;

(b) while programming the plurality of memory cells, independently determining whether each memory cell is in a programmed state; and (c) if a memory cell of the plurality of memory cells is determined to be in the programmed state, terminating the programming of the memory cell; wherein the programming of the memory cell is terminated at a time after the memory cell is determined to be in the programmed state.

* * * * *

UNITED STATES PATENT AND TRADEMARK OFFICE
CERTIFICATE OF CORRECTION

PATENT NO. : 6,574,145 B2  Page 1 of 1
DATED : June 3, 2003
INVENTOR(S) : Bendik Kleveland et al.

It is certified that error appears in the above-identified patent and that said Letters Patent is hereby corrected as shown below:

<u>Column 10,</u>
Line 22, after "claim 18," insert -- wherein --.
Line 47, after "claim 32," insert -- wherein --.

Signed and Sealed this

Fifteenth Day of June, 2004

JON W. DUDAS
*Acting Director of the United States Patent and Trademark Office*